United States Patent [19]

Lindmayer

[11] Patent Number: 4,855,603

[45] Date of Patent: Aug. 8, 1989

[54] PHOTOLUMINESCENT MATERIALS FOR RADIOGRAPHY

[75] Inventor: Joseph Lindmayer, Potomac, Md.
[73] Assignee: Quantex Corporation, Rockville, Md.
[21] Appl. No.: 127,118
[22] Filed: Dec. 1, 1987

Related U.S. Application Data

[63] Continuation-in-part of Ser. No. 870,809, Jun. 6, 1986, which is a continuation-in-part of Ser. No. 786,095, Oct. 10, 1985, Pat. No. 4,705,952.
[51] Int. Cl.$^4$ .................... H05B 33/00; C09K 11/08; G03C 5/16; B05D 5/06
[52] U.S. Cl. .......................... 250/484.1; 250/323.2; 252/301.45; 252/301.4 H; 264/21; 427/64; 430/139
[58] Field of Search .......................... 427/64, 66, 71; 252/301.4 S, 301.4 H, 301.6 S; 250/327.2, 7 E, 484.1 B, 486.1; 264/21; 430/139

[56] References Cited

U.S. PATENT DOCUMENTS

| | | | |
|---|---|---|---|
| Re. 31,847 | 3/1985 | Luckey | 250/327.2 A |
| 2,468,452 | 4/1949 | Leverenz | 252/301.45 |
| 2,468,714 | 4/1949 | Leverenz | 252/301.45 |
| 2,485,903 | 10/1949 | Miller | 252/301.45 |
| 2,521,124 | 9/1950 | Miller | 252/301.45 |
| 2,522,074 | 9/1950 | Urback | 252/301.45 |
| 2,527,365 | 10/1950 | Leverenz | 252/301.45 |
| 2,979,467 | 4/1961 | Keller | 252/301.45 |
| 3,668,142 | 6/1972 | Luckey | 252/301.4 S |
| 3,767,585 | 10/1973 | Otomo et al. | 252/301.4 H |
| 4,064,066 | 12/1977 | Toshinai et al. | 252/301.4 H |
| 4,211,813 | 7/1980 | Gravisse et al. | 252/301.4 S |
| 4,239,968 | 12/1980 | Kotera et al. | 250/484.1 B |
| 4,258,264 | 3/1981 | Kotera | 250/484.1 B |
| 4,261,854 | 6/1981 | Kotera et al. | 252/301.4 H |
| 4,292,107 | 9/1981 | Tanaka et al. | 427/64 |
| 4,297,584 | 10/1981 | Buchanan et al. | 252/301.4 H |
| 4,311,487 | 1/1982 | Luckey et al. | 252/301.4 H |
| 4,365,184 | 12/1982 | Higton et al. | 427/64 |
| 4,377,769 | 3/1983 | Beatly et al. | 252/301.6 S |
| 4,491,736 | 1/1985 | Teraoka | 250/327.2 A |
| 4,510,174 | 4/1985 | Holzapfel et al. | 427/71 |
| 4,510,388 | 4/1985 | Yamazaki et al. | 250/327.2 A |
| 4,539,138 | 9/1985 | Miyahara et al. | 252/301.4 H |
| 4,567,371 | 1/1986 | Ishizuka et al. | 250/327.2 A |
| 4,574,102 | 3/1986 | Arakawa et al. | 250/327.2 A |
| 4,628,208 | 12/1986 | Arakawa | 250/327.2 A |
| 4,695,725 | 9/1987 | Mori et al. | 250/327.2 C |
| 4,705,952 | 11/1987 | Lindmayer | 250/484.1 B |
| 4,725,344 | 2/1988 | Yocom et al. | 427/64 |
| 4,741,993 | 5/1988 | Kano et al. | 250/484.1 B |
| 4,755,324 | 7/1988 | Lindmayer | 252/301.4 S |

FOREIGN PATENT DOCUMENTS

8504892 11/1985 PCT Int'l Appl. .
492735 12/1936 United Kingdom .

OTHER PUBLICATIONS

Keller et al., "Studies on Some IR Stimulakle Phosphors", *Physical Review*, Nov. 1, 1957, pp. 663-676, vol. 108, #3.
Primak et al., "The Function of Fluxes in the Preparation of IR Sensors Phosphors of the Alkalene Earth Sulfides & Selemides", pp. 1283-1287; Jun. 1947, vol. 69, Dept. Chem, Poly Tech. Inst of Brooklyn 252/301.4S.
Lindmayer, "IR Phosphors as Sensors", *Sensors*, Mar. 1986, reprint.
Mims, "How to See Near-IR Radiation", Modern Electronics, May 1986, pp. 64-70.

*Primary Examiner*—Norman Morgenstern
*Assistant Examiner*—Marianne L. Padgett
*Attorney, Agent, or Firm*—Ostrolenk, Faber, Gerb & Soffen

[57] ABSTRACT

Photoluminescent materials for radiography are prepared using a base material, first and second dopants and a fusible salt. The base material is an alkaline earth metal sulfide such as strontium sulfide. Lithium fluoride is used to enhance the interdiffusion of materials. Samarium and cerium sulfide are used as the first and second dopants. Improved performance may be achieved by adding barium sulfate and/or cesium iodide. The photoluminescent material is made according to a process involving heating of the material to a fusing temperatue, grinding the material after cooling, and reheating the material to below the fusing temperature, but sufficiently high to repair the crystal surfaces. When cesium iodide is added it is mixed in after the grinding step. The material is then placed in a transparent binder and applied to a substrate, or deposited as a thin film directly on a substrate for different uses.

36 Claims, 4 Drawing Sheets

X-RAY RESPONSE OF SrS:Sm:x

PHOTOLUMINESCENT MATERIALS FOR RADIOGRAPHY

CROSS-REFERENCE TO RELATED APPLICATIONS

This application is a continuation-in-part of U.S. Patent Application Ser. No. 870,809 filed June 6, 1986, which is a continuation-in-part of U.S. Pat. Appication Ser. No. 786,095 filed Oct. 10, 1985, now U.S. Pat. No. 4,705,952 issued Nov. 10, 1987.

This application discloses materials which can be used for memories as described in the present inventor's U.S. Patent Application Ser. No. 870,877 filed June 6, 1986, and assigned to a common assignee. This application is also related to the present inventor's U.S. Patent Applications Ser. No. 034,332; 034,333; 034,334; 034,497, all filed on Apr. 3, 1987.

BACKGROUND OF THE INVENTION

1. Field of the Invention

This invention relates to electron trapping materials that are capable of storing radiographic images and a process for making and using such material.

2. Description of the Prior Art

Until recently, X-ray radiography was based entirely on photochemistry. Images of different parts of the body were obtained by exposing photographic film and then developing the film in conventional ways. The difficulty has always been that the silver halides used in film chemistry are not especially sensitive to X-rays. Thus, the patient was exposed to a radiation level which was determined solely by the level required to properly expose the film. The radiation level was eventually reduced with the introduction of fluorescent intensifying screens, which helped to reduce the X-ray exposure of the patient.

Since major advances have been made in electronic data handling, it has become possible to form images that no longer involve wet chemistry. Digital processing offers many advantages, such as high resolution, potentially greater sensitivity, reusability and easier storage. The sensitivity, which is controlled by the solid state target film, holds the key to reduced dosage.

Recently, Fuji using the technology disclosed by Kotera in U.S. Pat. Nos. 4,239,968 and 4,261,854 started to employ a photostimulable phosphor placed inside an X-ray cassette. After exposure of the phosphor the image is read in a "darkroom" by a laser scanner. The image appears in the form of light emission which can then be sensed and stored digitally or can be printed as a hard copy. Through the manipulation of the digital data base, contrast and other features of the image can be altered in conventional ways.

Gasiot, et al in U.S. Pat. No. 4,517,463 discloses a real time radiation imaging apparatus and method. Gasiot's real time device required rapid release of stored luminescent energy. Gasiot et al suggested phosphors such as calcium, strontium, magnesium and barium sulfides doped with europium and samarium compounds for providing rapid release of light. Barium sulfide doped with cerium and samarium was found acceptable to Gasiot, et al as was barium fluoro-chloride.

Human exposure to X-rays can be reduced somewhat through the use of these techniques. However, truly significant reduction in human exposure levels was not achieved because sufficiently sensitive phosphors with intense light output were not available.

The particular type of phosphor required belongs to a unique family of election trapping optical materials. In order to define this family of materials, it is useful to review its history, particularly since sometimes confusion exists over terminology. It is important to begin with the term luminescence, the ability of certain solids to emit light under different conditions.

Luminescence is a long known phenomenon of nature reaching back very far in history. Recorded observations reach back to the last century. Seeback and Becquerel observed momentary visible afterglow in certain materials. In 1889, Klatt and Lenard also observed some effects with infrared. During this time period, words like "phosphor" and "luminescence" appeared. In 1904, Dahms distinguished between "stimulation" and "quenching"; meaning inducing or stopping afterglow. Much of the later work is associated with Lenard, who received the Nobel Prize in 1905 in physics for cathode ray emission. He studied different phosphors until at least 1918. Later work can be found by Urbach in 1926 through 1934. These early scientists basically observed very small luminescent effects.

In 1941, a program was instituted by the National Defense Committee for development of light emitting phosphors. The work started at the University of Rochester, and other laboratories became involved; however, the projects ended with World War II. The following technical papers were published on this work between 1946 and 1949:

B. O'Brien, "Development of Infrared Phosphors", *J. Opt. Soc. of Am.*, vol. 36, July 1946, p. 369;

F. Urbach, et al., "On Infrared Sensitive Phosphors", *J. Opt. Soc. of Am.*, vol. 36, July 1946, p. 372;

G. Fonda, "Preparation and Characteristics of Zinc Sulfide Phosphors Sensitive to Infra-Red", *J. Opt. Soc. of Am*, vol. 36, July 1946, p. 382;

A. L. Smith, "The Preparation of Strontium Selenide and its Properties as a Base Material for Phosphors Stimulated by Infra-Red", *Journal of the Am. Chem. Soc.*, vol. 69, 1947, p. 1725;

K. Butler, "Emission Spectra of Silicate Phosphors with Manganese Activation". *Journal of the Electrochemical Society*, vol. 93, No. 5, 1948, p. 143; and "Preparation and Characteristics of Solid Luminescent Materials", Editors: G. R. Fonda and F. Seitz. John Wiley & Sons, Inc., New York, 1948.

These papers provide an early story on the materials studied. As decades went by, the effects were forgotten by most physicists. Only work in the field of cathodoluminescence for screens of cathode ray tubes and fluorescent lamps continued with any focus.

Thus, the field of luminescence is broad and refers to the ability of certain substances or materials to emit light when driven by an external energy source. When the driving energy source is light, the proper term is photoluminescence.

The most interesting class of materials are those which upon excitation by radiation can store electrons in "traps" for varying lengths of time as discussed by J. L. Summerdijk and A. Bril in "Visible Luminescence . . . Under I R Excitation", International Conference on Luminescense, Leningrad, August 1972, p. 86. In the case of deep traps, trapped electrons can be released at a later time by photons having an energy similar to the depth of the trap. Thermal discharging is negligible in the case of deep traps. Under these circumstances, it appears that information corresponding to an excitation radiation can be stored for later use. The information can be reconstructed in the form of visible light emission, activated by infrared. These materials are now called electron trapping optical materials.

The fundamentals of electron trapping material are the following: A host crystal is a wide bandgap semiconductor (II–VI) compound, normally without any special value. These crystals, however, can be doped heavily with impurities to produce new energy levels and bands. Impurities from the lanthanide (rare earth) series are some of the elements that can be accommodated in the lattice to form a "communication" band and a trapping level. The new communication band provides an energy band in which the untrapped electrons can interact. The trapping level at yet lower energies represents non-communicating sites.

Materials that display latent luminescent activity often include one or more types of sites where electrons may be trapped in an energized state. Upon application of suitable wavelengths of energizing radiation, such as visible light or X-rays, such sites become filled with electrons. The electrons are raised to an energized state via the communication band from which transitions, such as absorption and recombination, may take place. Upon removal of the energizing radiation, the electrons may be trapped at an energy level higher than their original ground state or may drop back to their original ground state. The number of electrons that become trapped is very much dependent upon the composition of the photoluminescent material and the dopants used therein.

If the trapping level is sufficiently below the level of the communication band, the electrons in them will be isolated from each other, will remain trapped for a long period of time, and will be unaffected by normal ambient temperatures. Indeed, if the depth of the trap is sufficient, the electrons will remain trapped almost indefinitely unless they are activated by specific light energies, or thermal energy much higher than room temperature.

The electrons will remain trapped until light or other radiation is applied to provide sufficient energy to again raise them to the level of the communication band, where a transition may take place in the form of recombination allowing the electrons to escape from the trap and release photons of visible light. The material must be such that room temperature thermal energy is insufficient to allow any significant portion of trapped electrons to escape from their traps. As used herein, "optical energy" shall include visible light, infrared light, ultraviolet light, X-ray, gamma radiation, beta and alpha particles unless otherwise noted, "photoluminescent material" is a material that exhibits the above characteristics.

Although various photoluminescent materials have heretofore been known, the properties have often been less than desirable. For example, photoluminescent materials have been used for locating infrared beams by outputting visible light upon placement of the material within an infrared beam, but such previous photoluminescent materials are not sensitive enough an emit relatively low levels of light. In the same manner, phosphors used in X-ray radiography required such high levels of X-ray radiation that most of the expected benefits of reduced exposure to humans were not realized.

The ratio of input energy to energy of light output in such materials is often very high. That is, a large amount of energy must be put into the material to provide a modest output of optical energy. The development by the applicant of photoluminescent materials that avoid or minimize the disadvantages discussed above opened up numerous practical applications for such materials.

The patents of Kotera and Gasiot et al cited above point to two separate advantages of their phosphor materials. Kotera claims his barium fluorohalide phosphors used in X-ray information storage have a sensitivity improvement factor of over a 1000 compared to Sm and Eu doped SrS or CaS based phosphors, suggested by Gasiot et al for their readout speed advantage over the barium fluorohalide phosphors of Kotera.

SUMMARY OF THE INVENTION

Applicant has discovered a composition and method for the substitution of Ce for Gasiot et al's Eu and the addition of other beneficial components to SrS phosphors that result in the desired sensitivity and the desirable speed of readout. This composition produces a highly desirable superior phosphor for X-ray radiography.

Independent of the Kotera and Gasiot et al work, applicant has searched for special, new phosphor materials for photonic applications. During this search, a particular composition was discovered that is extremely sensitive to nuclear and X-ray radiation. Such radiation will fill electronic traps, which can retain the information indefinitely. Since the amount of charge in the traps is proportional to the amount of radiation received, a full "gray scale" range of light output is available for image formation. When scanned in the darkroom by an infrared source, an image appears in the form of a spectrally narrow band of emission in the blue-green range of about 495 nm wave length. Experiments indicate that the X-ray sensitivity may be two orders of magnitude better than the phosphors taught by Gasiot et al, and almost an order of magnitude more sensitive than the Kotera phosphor.

The introduction of an X-ray plate having an extremely sensitive phosphor would have a revolutionary impact on radiography, particularly since continued concern is expressed over the level of radiation dosage a patient receives during certain examinations. Computer enhanced radiography has important benefits which can be further improved with a more sensitive phosphor film. Computer enhanced radiography provides a real time readout that can eliminate the need for repeat examinations due to improper X-ray exposure. Sensitive phosphors will allow for low-dose applications, including mammography and pediatrics, and portable devices are also possible because of the small X-ray source required. Storing of information and its recall may be made much simpler and more economic by storing the digital data. Through the continued reuse of the phosphor, the cost of taking an X-ray picture could be reduced.

The new infrared stimulable phosphor "film" can be formed by laminating a fine powder into a sheet. The crystallites employed are formed from elements in columns II–VI of the periodic table of elements, doped with specific impurities. Applicant has used SrS, which is doped with elemental Sm and compounds of Ce. The cerium compound establishes a new band, and the Sm provides states for holding excited electrons in a higher energy state indefinitely. Further improvements were observed by introduction of CsI. Upon exposure to infrared, emission occurs around a wavelength of 495 nm which provides a blue-green light, as the electrons return to their ground state. The new materials developed can emit light more than an order of magnitude brighter than those previously known.

When using a scanning infrared laser, which may be a simple solid state type, the traps can be emptied "at once" or at least within nanoseconds. This leads to a bright reading of the information point by point. Coupled with a sensor, such as a photomultiplier, the sensitivity of the material is high. Simple eye observation indicates that the X-ray image is visible at a small fraction of normal exposure levels. Sensitive scanning apparatus can assure the possibility of two orders of magnitude reduction in numan X-ray exposure.

The applicant discovered the unexpected result that if an electron trapping material contains a cerium compound, the high-energy radiation sensitivity for imaging is extremely high. Applicant also discovered that the addition of CsI greatly enhanced the intensity of the light output.

Experiments show that barium added to the electron trapping materials has only modest effects on X-ray sensitivity. Since phosphors using other dopants, such as europium, are insensitive to X-rays, it follows that the sensitivity does not simply arise from the presence of heavy elements, but from the unique behavior of cerium.

While at the present time there is no precise explanation for the unique behavior of cerium, a tentative explanation is that the cerium compound creates numerous high level energy bands which allow for a much larger number of electrons to rise in energy upon impact by X-ray photons. This dopant improves the light output per absorbed X-ray photon by orders of magnitude.

A primary object of the present invention is to provide new photoluminescent materials that display at least an order of magnitude better sensitivity to high-energy radiation, such as X-rays.

A more specific object of the present invention is to provide radiation sensitive photoluminescent materials having sufficient electron trap depth and sufficient density of electron traps to be useful as an image memory material.

Another object of the invention is to provide a photoluminescent material that outputs blue-green light, in the process of reconstructing the image, when subjected to infrared radiation.

Yet another object of the present invention is to realize a new and improved process for making radiation imaging materials.

The above and other objects of the present invention which will become more apparent as the description proceeds, are realized by a high performance electron trapping radiation-sensitive photoluminescent material consisting essentially of a base material, a first dopant, a second dopant and a fusible salt. More specifically, the radiation-sensitive photoluminescent material comprises: a base material selected from a group of alkaline earth metal sulfides, a first dopant of samarium; a second dopant selected from the group of cerium oxide, cerium fluoride, cerium chloride, and cerium sulfide; and a fusible salt, preferably lithium fluoride. Enhanced performance is realized by a final addition of a cesium halide.

The invention further comprises the radiation-sensitive photoluminescent material described above disposed upon a substrate. If desired, the material may be applied upon the substrate by the use of a transparent binder. Mixing the transparent binder with the photoluminescent material will not significantly affect the radiation/optical properties of the material. Reference in this application to "consists essentially of a base material, first dopant, second dopant, and fusible salt" shall be interpreted as including those materials alone or in combination with a transparent binder.

The invention also comprises the radiation-sensitive photoluminescent material described above, deposited in a thin film form on a suitable substrate, such as sapphire or alumina by electron beam deposition, sputtering, chemical vapor deposition and the like, and heated to moderate temperatures such as 500 to 900 degrees Celsius. The surface crystals so developed display the radiation-sensitive photoluminescent properties described above with greater resolution. Reference in this application to "consists essentially of a base material, first dopant, second dopant, and fusible salt" shall be interpreted as including those materials alone or in combination in a surface-crystalline form on a foreign substrate.

The process of the present invention comprises the steps of mixing a base material, such as strontium sulfide, a first dopant of samarium, a second dopant of a cerium compound. After mixing, heating the resultant mixture to a temperature sufficient to fuse the mixture and allow for diffusion of the different dopants. This first heating step takes place in a furnace with an inert atmosphere and a temperature above 950° C.

A further processing direction comprises the steps of grinding the resultant solid substance into a powder; and after grinding, adding cesium iodide and reheating the resultant powder to a second temperature below the first temperature, but sufficiently high to repair crystal defects in the powder, thereby yielding an electron trapping radiation sensitive material without fusing the powder into a mass. The grinding step yields a powder having particle sizes typically less than 100 microns. The process may further include a step of mixing the optical material with a transparent binder and applying it to a substrate.

Another processing direction comprises the steps of creating chunks of the original fused material and depositing it on a smooth foreign substrate in the form of thin film, such as by evaporation or sputtering, reheating the resultant film to a second temperature below the first temperature but, sufficiently high to form a surface crystallized film, thereby yielding a radiation-sensitive electron trapping material with high resolution. The film thicknesses may be in the range of 2–100 microns.

DESCRIPTION OF THE DRAWINGS

The above and other features of the present invention will be more readily understood when the following detailed description is considered in conjunction with the accompanying drawings wherein like characters represent like parts throughout the several drawings and in which.

DETAILED DESCRIPTION

Figure 1:
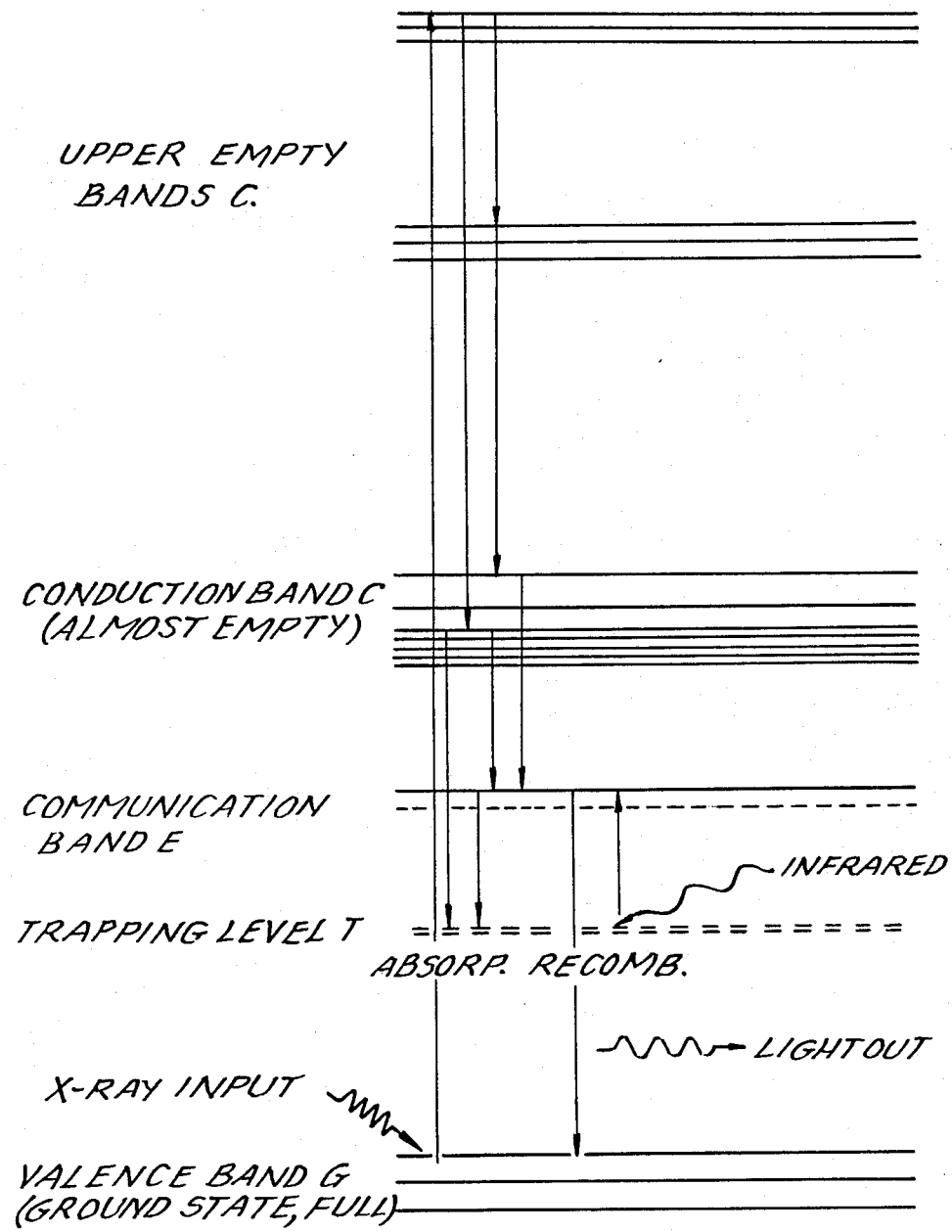
FIG. 1 is a schematic illustrating the simplified principle of operation of the present invention.

FIG. 1 shows the principles of operation of the present invention. The basic multi-crystalline photoluminescent material used has a valence band G full of electrons at a ground state. The material is subjected to high-energy particles or photons, generated by a radiation image. The photons function to energize certain electrons in the valence band G. An electron shown on the left is originally in a valence band G and is subjected to radiation. Here, electrons absorb photons, and they rise to the communication band E and to higher bands C created by a dopant of a cerium compound Within a short time, electrons will attempt to return to their ground state; those that avoid traps will emit light in the form of fluorescence, while others will be captured in trapping level T, all depending upon the composition of the material and available trapping sites. Electrons in the trapping level T, will remain isolated from other electrons and trapped, holding the radiation image.

Reading of the radiation image is accomplished by an infrared scanner that provides sufficient additional external energy in order to raise the electrons back up to the communication band E from which they recombine, emitting blue-green light. As shown on the right side of FIG. 1, trapped electrons may be stimulated by infrared electromagnetic energy to move them back to the communication band E where they may interact with each other and fall back to band G and output photons of visible light, reconstructing the radiation image in the process.

The materials of the present invention work upon the principle illustrated by FIG. 1 whereby radiation-induced images may be "stored" by the phenomenon of electron trapping and the image may be freed by application of infrared radiation to push the electrons up above the trap and allow them to return to the valence band. The number of trapping sites, the depth of the traps, the probability of transitions occurring in the communication band and the degree of X-ray absorption are all dependent upon the composition of the material used.

As previously mentioned, the radiation-sensitive photoluminescent material of the present invention comprises a composition of a base material, a first dopant, a second dopant and a fusible salt.

The base material is selected from the group of alkaline earth metal sulfides. Strontium sulfide is preferred because efficient light trapping and emission can be accomplished in this material and it has a high enough Z (atomic number) to absorb a significant portion of incident high energy radiation, such as X-rays. The first dopant is samarium metal which provides the trapping sites. The second dopant is selected from the group of cerium oxide, cerium fluoride, cerium chloride, and cerium sulfide.

Figure 4:
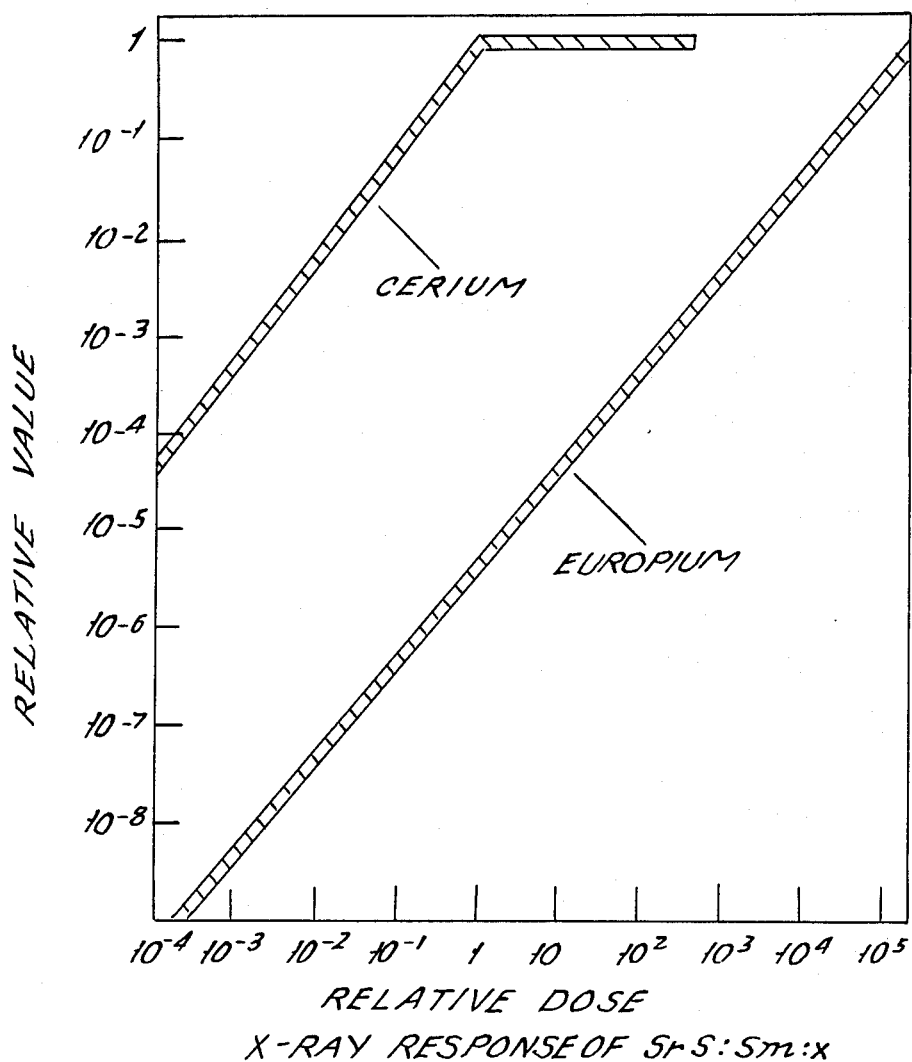
FIG. 4 shows the approximate range of sensitivity for a composition containing a cerium compound and for another containing a europium compound.

It may be mentioned that while a europium compound provides somewhat better light emission efficiency, the X-ray sensitivity is only 1/1000th to 1/100th of that achieved with cerium, making the use of europium impractical for radiation dose reduction. This is illustrated by FIG. 4 wherein the trap saturation of cerium and europium doped phosphors are compared.

The addition of a cesium halide to the mixture after the first heat treatment tends to improve the light output intensity by 25-50%.

EXAMPLE 1

A radiation-sensitive photoluminescent material for outputting blue-green light is made from a mixture having the following composition:

Strontium sulfide: 80 parts
Samarium: 150 parts per million
Cerium sulfide: 1200 parts per million
Lithium fluoride: 10 parts
Barium sulfate: 10 parts As used above and throughout this application, "parts", "parts per hundred" and "parts per million" shall refer to parts by weight unless otherwise noted.

The use of barium sulfate is optional as it provides only a minor improvement in the emission efficiency. Thus, the barium sulfate may be used in quantities from 0 to 10 parts per hundred.

The mixture is ground and homogenized and then placed into a graphite cruicible within a furnace flushed with a dry nitrogen atmosphere (derived from a liquid source) or other dry inert atmosphere such as argon, and heated to between 950° C. and 1300° C. (preferably 1150° C.) for 30 minutes to one hour such that a fused mass is formed. For longer heating times, the fused mass could be formed at temperatures as low as 950° C. Temperatures as high as 2000° C. could be used to form such a fused mass in shorter times. For longer and higher heating temperatures the quantity of fusible salt can be reduced or eliminated.

After cooling, the fused mass is ground using standard techniques into a fine powder having typical particle sizes of 5 to 100 microns. After grinding, 1 part cesium iodide per 100 parts of total composition by weight is added to the powdered material, which is then heated to about 300° C. to 700° C. (preferably 600° C.) in a graphite or alumina crucible within the nitrogen or other inert atmosphere furnace. This second heating is below the fusing temperature of the material (about 700° C.) and is maintained for 10 to 60 minutes (preferably 30 minutes). This second heating step intimately incorporates the cesium iodide, removes internal stresses and repairs damage done to the crystallites during the grinding step.

The use of a cesium halide is optional; however, it does provide a significant improvement in emission efficiency.

After the second heating, the material is cooled and the powdered material is then mixed with a suitable binder or vehicle such as acrylic, polyethylene, or other organic polymer. After the material has been mixed with a binder, it is applied as a coating to a substrate. For X-rays, the coating of the radiation sensitive photoluminescent material upon the substrate will preferably be between 100 microns and 500 microns in thickness. Depending upon the use to be made of the material, the substrate may be clear plastic, aluminum oxide, glass, paper, or most any other solid substance.

Particular mention should be made of fusing the particles to certain substrates at elevated temperatures. In this respect, aluminum oxide (alumina) and its crystalline form, sapphire, are specially important. For example, dispersing the photosensitive particles on a sapphire substrate and then heating the structure to about 1000°

C. in a dry atmosphere further improves the efficiency of the optical material and fuses the particles to such substrates without the use of a binder. Conversely, when fusing is attempted with a quartz substrate, the optical properties are destroyed. In general, substrates containing silicon tend to destroy the efficiency of the material above some 800° C.

The dopant cerium sulfide in the above mixture is used for establishing the communication band E and the upper bands C. Samarium is used to establish the electron trapping level T. Preferably 150 parts per million of samarium are used, but the samarium could alternatively be between 50 parts per million and 500 parts per million, depending on the specific application. For example, in the case of X-rays where long term storage is not required, the samarium concentration could be increased significantly. The cerium compound concentration may be between 200 and 2000 parts per million with 1000 and 1500 parts per million being preferred and 1200 parts per million being the optimal value. The cesium compound concentration in parts per hundred may be between 0.1 and 5, with 0.5 to 2 being preferred, and around 1 being optimum.

Figure 2:
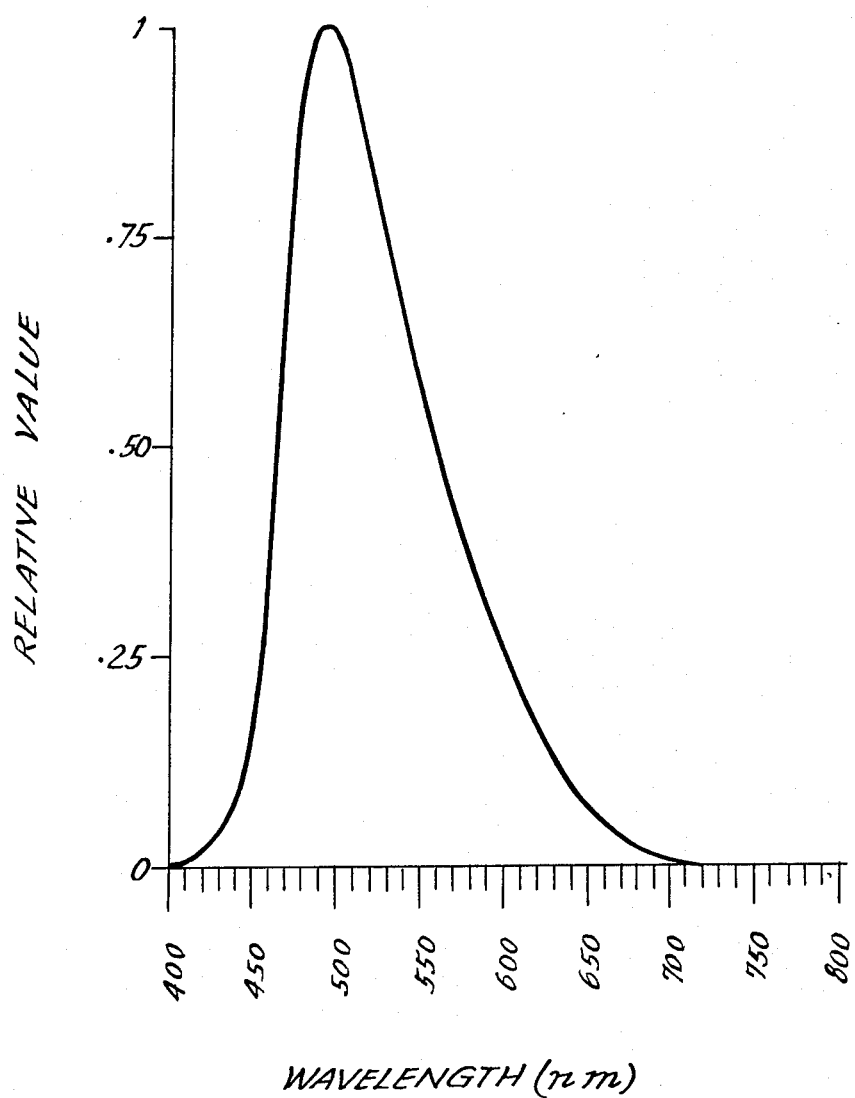
FIG. 2 shows the spectrum of light output of the radiation-sensitive optical material when interrogated by infrared light.

The mixture resulting from the above process provides a depth for electron traps of about 1.2 electron volts below the communication band and has an output spectrum as shown in FIG. 2 which illustrates that the center frequency of the output has a wavelength of approximately 495 nanometers corresponding to a blue-green light.

Figure 5:
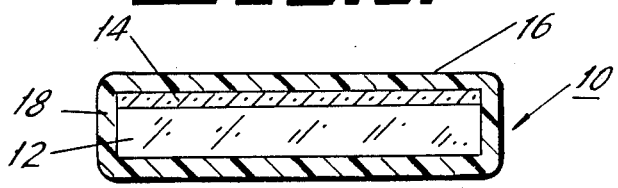
FIG. 5 shows a cross-section of photoluminescent material disposed on a substrate.

FIG. 5 shows the photoluminescent material disposed on a substrate forming a device 10. As illustrated, the device 10 is a sheet shown in vertical section having a substrate 12 and the radiation-sensitive photoluminescent material 14 applied with a transparent binder to the substrate 12. The substrate 12 may be paper, aluminum oxide, plastic, such as PVC, or other solid material. Such a sheet can then be used, for example, as a reusable X-ray "film" replacing the conventional photographic film. The substrate may be transparent or opaque; in X-ray applications reflecting back surfaces may be desired, which can be assured by a thin aluminum coating. The material 14 establishes a planar surface 16. An optional transparent coating 18 may encapsulate the material 14 and substrate 12.

The sheet, or device 10, of FIG. 5 is generally useful in recording the spatial distribution of high-energy particles or photons. In operation, the packaged sheet 10 may be discharged by exposure of the photoluminescent material 14 to an infrared light source such that all electrons will be discharged from the traps. When shielded from visible light (such as by thin aluminum coated plastic) the sheet is ready to record high-energy particles or photons without interference from background light. The detection of high-energy radiation may take place in space, around terrestrial radiation sources, X-ray situations or as down-to-earth situations as detection of radon.

Figure 3:
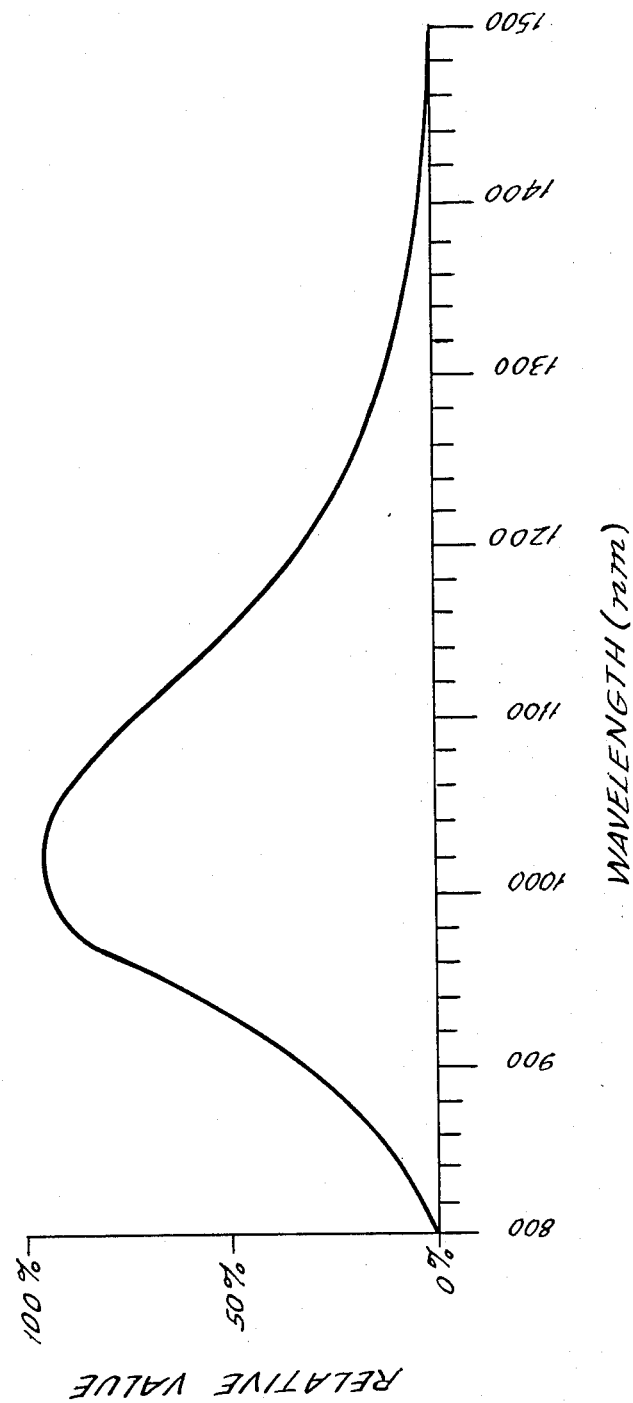
FIG. 3 shows the range of infrared wavelengths for the interrogating light.

In reconstructing the recorded spatial distribution, material 14 will output a blue-green light in proportion to the original radiation, when illuminated by an infrared beam. FIG. 3 shows the infrared spectrum that may be used for "reading" the phosphor. The infrared "reading" source may be broad, illuminating the whole sheet at once, or highly pointed, such as an infrared laser beam. In the former case, the spatial information recorded in the sheet will show up in its entirety and can be recorded on a photographic film. In the latter case, high speed reading is possible through scanning with a detector; the blue-green emission can be easily detected, converted to electrical signals and recorded in numerous ways, such as by digital data storage. Various data handling schemes are well known to those versed in the art.

EXAMPLE 2

Another radiation-sensitive photoluminescent material for outputting blue-green light is made from a mixture having the following composition:

Strontium sulfide: 80 parts
Samarium: 150 parts per million
Cerium oxide: 1000 parts per million
Lithium fluoride: 10 parts
Barium sulfate: 10 parts Again, "parts", "parts per hundred" and "parts per million" refer to parts by weight. The heat treatment, subsequent grinding, cesium halide addition, reheating and application to a substrate are carried out as in Example 1.

EXAMPLE 3

For application as thin-films, a radiation-sensitive photoluminescent material for outputting blue-green light is made from a mixture having the following composition:

Strontium sulfide: 78 parts
Samarium: 150 parts per million
Cerium sulfide: 1200 parts per million
Lithium fluoride: 10 parts
Barium sulfate: 10 parts
Cesium sulfate: 2 parts This mixture is subjected to heat treatment as in Example 1, resulting in a block of material already including the cesium after the first temperature treatment, and thereby suitable for deposition as a radiation-sensitive thin film by methods commonly known in the thin film art. Such methods could be thermal evaporation from boats or filaments or electron-beam sources or physical deposition by sputtering. It may be necessary to heat the substrate during the deposition or subsequent to the deposition in order to produce a micro-crystalline structure in the film.

As was mentioned before, the substrate for the radiation sensitive photoluminescent material could be aluminum oxide in the form of sapphire or ceramic. When the material is deposited as a thin film, or fused to such a substrate, organic binders can be avoided, which is desirable in certain applications. It is possible, for example, to use an all solid state plate for reusable X-ray imaging without worrying about the degradation of the organic binder. In other words, the materials may be used in powder form (thick film), and micro-crystalline form (thin film).

Grinding is not employed for thin film applications. Thin films may be particularly useful in detection of alpha particles, beta particles and low-energy X-rays whose penetration depth is less than high-energy X-rays. Here, the original fused material is used in blocks as a source for deposition, for example, by evaporation or sputtering on a sapphire substrate which may be heated or followed by a 500° C. to 800° C. surface crystallization step to form a film having a thickness of 0.5 micron or greater.

Although various specific details have been discussed herein, it is to be understood that these are for illustrative purposes only. Various modifications and adaptations will be apparent to those skilled in the art. Accordingly, the scope of the present invention should be determined by reference to the claims appended hereto.

What is claimed is:

1. An electron trapping radiation-sensitive photoluminescent material, comprising:
   a base material selected from the group of alkaline earth metal sulfides;
   a first dopant of samarium;
   a second dopant selected from the group of cerium oxide, cerium fluoride, cerium chloride, and cerium sulfide; and
   a cesium halide.

2. The photoluminescent material of claim 1, further comprising a fusible salt.

3. The photoluminescent material of claim 2, wherein said fusible salt comprises lithium fluoride.

4. The photoluminescent material of claim 2, wherein the fusible salt is provided in a quantity of up to 10 parts per hundred by weight.

5. The photoluminescent material of claim 1, wherein said base material comprises strontium sulfide.

6. The photoluminescent material of claim 1, wherein the base material is strontium sulfide, and the photoluminescent material additionally comprises lithium fluoride.

7. The photoluminescent material of claim 1, wherein there are between 50 and 500 parts per million of samarium by weight.

8. The photoluminescent material of claim 1, wherein said second dopant comprises cerium sulfide, there being between 200 and 2000 parts per million of cerium sulfide by weight.

9. The phtoluminescent material of claim 1, wherein said second dopant comprises cerium sulfide, there being between 1000 and 1500 parts per million of cerium sulfide by weight.

10. The photoluminescent material of claim 1, wherein said second dopant comprises cerium sulfide, there being approximately 1200 parts per million of cerium sulfide by weight.

11. The photoluminescent material of claim 1, wherein the base material is strontium sulfide, the first dopant, samarium, is provided in a quantity of between 50–500 parts per million by weight, and the second dopant, cerium sulfide, is provided in a quantity of between 200–2000 parts per million by weight.

12. The photoluminescent material of claim 1, wherein the base material is strontium sulfide, the first dopant is elemental samarium provided in a quantity of between 50–500 parts per million by weight, and the second dopant, cerium sulfide, is provided in a quantity of between 1000–1500 parts per million by weight.

13. The photoluminescent material as described in claim 1, further comprising barium sulfate in a quantity of up to 10 parts per hundred by weight.

14. The photoluminescent material of claim 1, wherein said material is disposed upon a substrate.

15. The photoluminescent material of claim 14, wherein the substrate is aluminum oxide.

16. The photoluminescent material of claim 14, wherein the substrate is alumina.

17. The photoluminescent material of claim 14, wherein the substrate is sapphire.

18. The photoluminescent material of claim 14, wherein the material is from 0.5 microns to 500 microns in thickness.

19. The photoluminescent material of claim 11, wherein the cesium halide is cesium iodide.

20. The photoluminescent material of claim 19, wherein there are between 0.1 and 5 parts cesium iodide per hundred by weight.

21. The photoluminescent material of claim 19, wherein there are between 0.5 to 2 parts cesium iodide per hundred by weight.

22. The photoluminescent material of claim 19, wherein there is approximately 1 part cesium iodide per hundred by weight.

23. The photoluminescent material of claim 1, additionally comprising:
   a fusible salt; and
   barium sulfate.

24. A radiation detecting device, comprising:
   a substrate; and
   a cerium doped strontium sulfide phosphor containing a cesium halide, as recited in claim 1 disposed on said substrate.

25. A radiation detecting device as described in claim 24, wherein the cesium halide comprises cesium iodide.

26. A radiation detecting device as described in claim 25, wherein the phosphor additionally comprises barium sulfate.

27. A process for preparing a radiation-sensitive photoluminescent material, comprising the steps of:
   mixing,
      a base material selected from the group of alkaline earth metal sulfides,
      a fusible salt, there being up to 10 parts fusible salt per hundred by weight,
      a first dopant of samarium, and
      a second dopant selected from the group of cerium oxide, cerium fluoride, cerium chloride, and cerium sulfide;
   heating the resultant mixture to a first temperature sufficient to fuse the mixture;
   grinding the resultant fused mixture into a powder;
   adding a cesium halide; and
   reheating the resultant powder to a second temperature below said first temperature but sufficiently high to incorporate the cesium halide to yield an electron trapping radiation-sensitive optical material without fusing the powder into a mass.

28. The process of claim 27, wherein said heating step takes place in an inert atmosphere and at a temperature of above 950° C.

29. The process of claim 27, wherein the grinding step yields a powder having particle sizes of 100 microns or less.

30. The process of claim 27, wherein said reheating step takes place in an inert atmosphere and at a temperature between 300° C. and 700° C.

31. The process of claim 27, wherein said heating takes place in an inert atmosphere and at a temperature between 950° C. and 1300° C.

32. The process of claim 27, further comprising the steps of:
   mixing the optical material with a transparent binder; and
   applying the mixture to a substrate.

33. The process of claim 32, additionally comprising the step of encapsulating the substrate and optical material with a transparent coating.

34. The process of claim 27, wherein the heating step has a duration of from 30 minutes to one hour, the duration being temperature dependent.

35. The process of claim 27, additionally comprising the steps of:
 disposing the optical material on an alumina substrate; and
 heating said substrate to about 1000° C. in a dry inert atmosphere.

36. The process of claim 27, wherein the cesium halide is cesium iodide.

* * * * *